United States Patent [19]

Petroshanoff

[11] 3,848,953

[45] Nov. 19, 1974

[54] DEVICE FOR INSERTING AND CLAMPING A PRINTED CIRCUIT BOARD

[75] Inventor: George J. Petroshanoff, Torrance, Calif.

[73] Assignee: Tridair Industries, Torrance, Calif.

[22] Filed: Mar. 14, 1974

[21] Appl. No.: 451,331

Related U.S. Application Data

[63] Continuation of Ser. No. 334,800, Feb. 22, 1973, abandoned.

[52] U.S. Cl. ............ 339/92 M, 317/101 D, 339/65

[51] Int. Cl. ............ H01r 13/54

[58] Field of Search ............ 339/65, 66, 75, 92, 17; 317/101

[56] References Cited

UNITED STATES PATENTS

| | | | |
|---|---|---|---|
| 2,746,022 | 5/1966 | Gilbert | 339/92 M |
| 2,953,767 | 9/1960 | Jackson et al. | 339/66 M |
| 3,066,244 | 11/1962 | Defandorf et al. | 339/92 M |
| 3,191,097 | 6/1965 | Dano et al. | 339/17 LM |
| 3,467,891 | 9/1969 | Mogle | 339/75 MP |

*Primary Examiner*—Joseph H. McGlynn
*Attorney, Agent, or Firm*—T. A. Seeman

[57] ABSTRACT

A device for inserting and clamping to a mounting chassis a printed circuit board of the type having electrical pin contacts at one end. The device consists of two distinct components: a jack screw rotatably mounted within an alignment housng which is attached to the top of a circuit board and a guide, with an included nut, which is attached to the chassis. In installing the circuit board, the alignment housing is first positioned within the guide to properly align the circuit board for engagement of the contact pins with female interconnects on the chassis. Thereafter, rotation of the jack screw within the guide nut clamps the board into electrical engagement.

1 Claim, 4 Drawing Figures

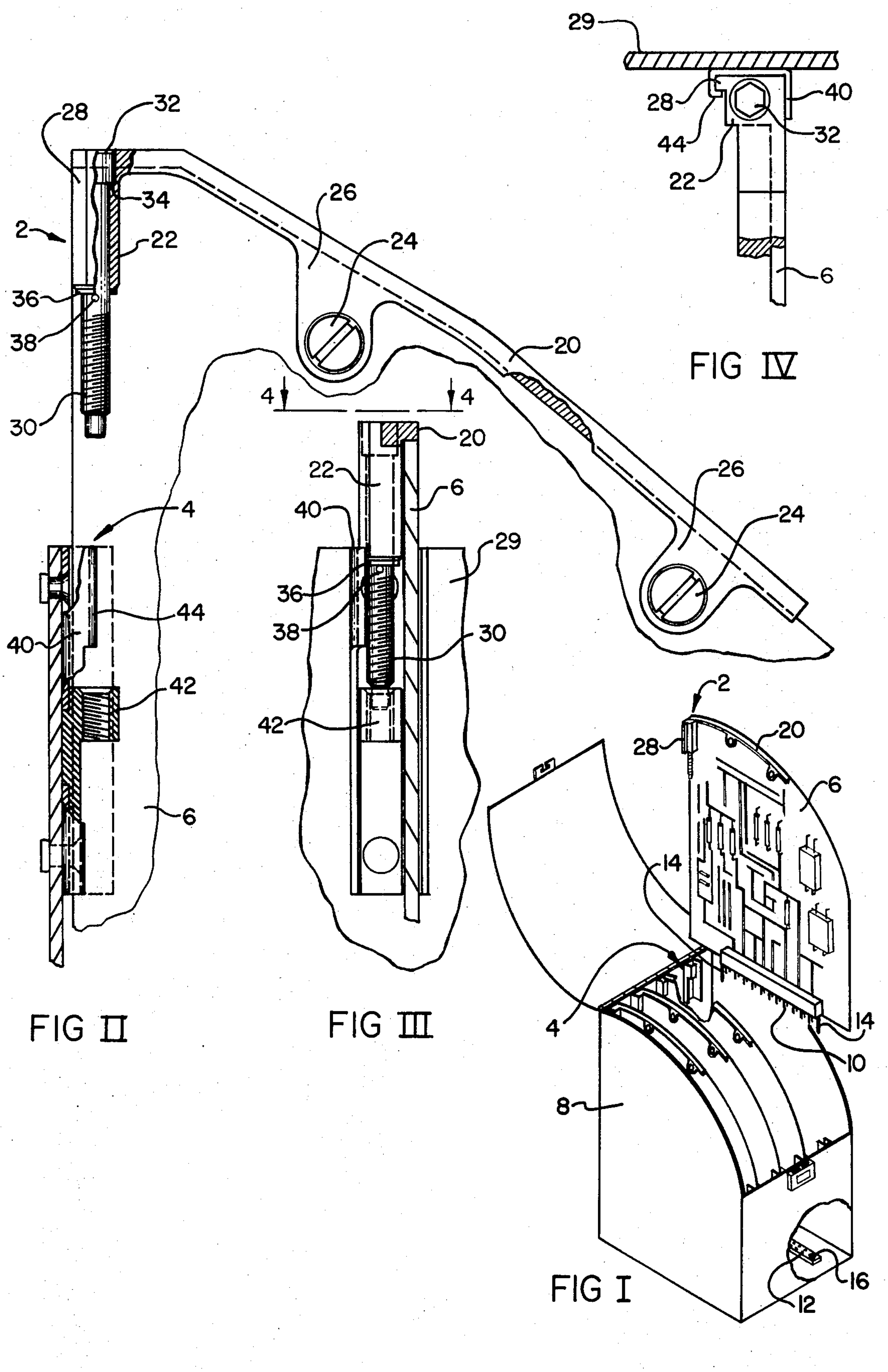
FIG I, FIG II, FIG III, FIG IV

DEVICE FOR INSERTING AND CLAMPING A PRINTED CIRCUIT BOARD

This is a continuation, of application Ser. No. 334,800, filed 2/22/73, and now abandoned.

BACKGROUND OF THE INVENTION

This invention relates to a device for inserting and clamping circuit boards to a mounting chassis.

Printed circuit boards are well known in the art. Commonly, each board contains at one end male contact pins for electrically connecting the board with female interconnects carried on a chassis or the like. The board may also contain longer alignment pins adjacent the contact pins to appropriately align the contact pins prior to electrical engagement. Frequently, a number of these boards are stacked-mounted in close array within the chassis and provision is made in the chassis to electrically connect the several boards in a desired circuitry. For most efficient electrical engagement, it is imperative that the circuit boards be firmly seated such that the male contact pins fully engage the female interconnects.

Previously, it has been customary to install the circuit board into the chassis by hand and thereafter to rely on the contact pressure of the contact pins within the female interconnects to maintain the board in electrical engagement. Unfortunately, this has been unsatisfactory for a number of reasons. First, since the boards are closely-stacked to preserve space, the installer can only detect by "feel" to determine if the board is aligned and then seated properly, and he usually does not have adequate room to grasp the board properly for removal. As a consequence, the circuit boards are frequently not adequately seated which causes an unnecessary amount of time to reseat the board after the defeat is revealed upon subsequent electrical testing, and the delicate electrical pins are often damaged when manually installing or removing the board. This is particularly economically harmful when a replacement board is not readily available, causing a shutdown of machinery until the board can be replaced. Furthermore, after the boards have been manually inserted, the boards have a tenancy to loosen and disengage with mechanical vibration causing a failure in the electrical system.

SUMMARY OF THE INVENTION

Therefore, it is an object of this invention to provide a device for inserting and clamping a circuit board to a chassis, which device is simple and easy to operate and which will seat a circuit board properly without damaging its pin contacts.

Another object is to provide a device for inserting and clamping a circuit board which will first adequately align the circuit board for electrical interconnection prior to inserting and clamping the board.

Still another object provided is a device for inserting and clamping a circuit board wherein the clamping load will be distributed over the board.

A further object is to provide, for inserting and clamping a circuit board, a device that is of small proportion such that it may be used with the boards even when the boards are stacked in close array within a chassis.

Another object is to provide a device which will positively clamp a circuit board against disengagement caused by mechanical vibration.

Another object is to provide a device which will readily remove a circuit board without damaging the board's contacts.

Another object is to provide a device for inserting and clamping a circuit board which is easily adapted for use of boards of different configurations.

Another object is to provide a device for inserting and clamping a circuit board which is economical and feasible to manufacture.

Further objects of the invention will in part be obvious and will in part appear hereafter.

For a fuller understanding of the nature and object of the invention, reference should be had to the following detailed description taken in connection with the accompanying drawings in which:

The invention comprises a device for inserting and clamping to a chassis or the like a circuit board of the type having pin-type contacts at one end for insertion into female innerconnects on a chassis. The device consists of two distinct components or parts. The first component is attached to the circuit board and the second component is attached to the mounting chassis.

The circuit board component comprises a jack screw freely rotatable within an alignment housing integral with a strut leading over and attached to the upper end of the circuit board. The chassis component consists of a channel-like guide adapted to slidably receive the alignment housing and retain it, and the associated circuit board, against transverse and tilting movement with respect to the longitudinal axis of the guide while aligning the board for electrical engagement. The guide further contains a nut-member for receiving the jack screw.

The chassis component is suitably positioned such that when the alignment housing of the circuit board is inserted into the guide, the board's electrical contact pins are perfectly aligned with the female interconnects of the chassis. Thereafter, rotation of the jack screw within the guide nut clamps the circuit board and its pin contacts into electrical engagement with the female interconnects. The circuit board can subsequently be removed by reversing the process through the unscrewing of the jack screw.

Because the board is kept in perfect alignment during the insertion or removal of the pins with the female interconnects, damage to the delicate contact pins is prevented. Importantly, the strut assists in maintaining the board in alignment and uniquely distributes the load during the clamping process. Owing to its small size and manner of application, the device is particularly suitable for use with circuit boards that are stacked in very close array within the chassis.

BRIEF DESCRIPTION OF THE DRAWINGS

FIG. 1 is a perspective view illustrating the components of the invention attached respectively to a mounting chassis and a circuit board with the circuit board shown as it be just prior to assembly;

FIG. 2 is a side view, partially broken away and partially in cross section, showing the inventive components of FIG. 1 in preparation for engagement;

FIG. 3 is an end view, partially in cross section illustrating the arrangement of the components of FIG. 2 in partial engagement; and FIG. 4 is a partial top view of the components taken along the lines 4—4 of FIG. 3.

Similar reference characters refer to similar parts throughout the several views of the drawing.

The invention accordingly comprises the features of construction, combination of elements, arrangement of parts which will be exemplified in the construction hereinafter set forth, and the scope of the invention will be indicated in the claims.

DETAILED DESCRIPTION OF PREFERRED EMBODIMENTS

As illustrated in the drawings, the invention comprises a device for inserting and clamping a circuit board to a chassis. FIG. 1 illustrates the discreet components 2, 4 of the invention attached respectively to a typical circuit board 6 and chassis 8 with the circuit board positioned for assembly to the chassis. The chassis serves as a holder and container for the boards as well as electrically interconnecting the boards.

The circuit board 6 is of the type having a plurality of pins, blade or other type of male contacts 10 for electrical engagement with conventional female interconnects 12, only a portion of which are shown. It may also have longer alignment pins 14 provided to engage alignment holes 16, only one of which is shown, on the chassis, to assist in the alignment of the contact pins 10 with respect to the female interconnects 12.

As shown in the typical application, the circuit boards 6 are stacked in close array on the chassis with very limited space between them to make the assembly as compact as possible. As will be described in greater detail, the device constituting the invention insures that the circuit boards are inserted into proper electrical alignment with the chassis without damaging the contact pins or other components of the board and thereafter securely clamps the boards to prevent inadvertent disengagement resulting from vibration and the like.

As stated previously, the inventive device consists of two discreet components. For ease of description, one component is designated a circuit board component 2 and the other component is designated a chassis component 4. As best shown in FIGS. II, III and IV, circuit component 2 comprises a strut 20, preferably made of metal or plastic, and an integral alignment housing 22 at one end thereof. Strut 20, slightly wider than the thickness of the circuit board, conforms to the upper contour of the board as shown and is attached to the board by screws 24 extending through depending strut tabs 26. Importantly, the strut extends sufficiently along the top of the board to evenly distribute the load on the board when it is being inserted in the chassis as will be explained later in greater detail.

Alignment housing 22 extends downwardly contiguous to one face of the circuit board and adjacent one end thereof. It is generally rectangular with a locking projection 28 (FIG. IV), extending along its length along one face thereof.

A jack screw 30 is rotatably received within a central bore of the housing 22. The jack screw is formed with an enlarged head 32, preferably headed to be driven by an allen wrench, and is disposed within a counter bore 34 of housing 32 such that it is flush with the upper surface of the housing. As is conventional, the shank of the jack screw is smooth adjacent the housing and screw-threaded in the lower portion with a reduced tip to facilitate the engagement with a nut-member. The anterior end of the counter bore forms a shelf to prevent longitudinal movement of the jack screw in one direction and a retaining washer 36 cooperating with a pin-keeper 38, extending through the screw, prevents longitudinal movement in the other direction such that the jack screw 30 is freely rotatable within the housing but axially constrained therein.

Chassis component 4 consists of a substantially U-shaped channel-like guide 40 preferably fabricated from sheet metal and an attached guide nut or nut member 42. Along its upper length, as viewed, one depending leg of guide 40 extends further outwardly and then inwardly forming what is designated a wraparound portion 44. This wraparound portion has a cross-sectional configuration and is adapted to receive in sliding engagement locking projection 28 when the alignment housing 22 is received within the guide as best seen in FIG. IV. There is limited clearance between housing 22 and the upper portion of guide 40 to prevent the board from tilting and to maintain it parallel or in longitudinal alignment with the longitudinal axis of the guide. Importantly, the strut assists in maintaining the board in longitudinal alignment by its support of the board along the board's upper surface. Guide nut 42 is suitably positioned to receive jack screw 30 when the alignment housing 22 is within guide 40.

The guide is riveted to the chassis wall 29 adjacent the open end of said chassis as shown with the longitudinal axis of the guide extending toward female interconnects 12, in a location such that when the alignment housing 22 is placed within the guide, the alignment pins 14 and male contacts 10 of the circuit board 6 are in perfect alignment with their female counter parts on chassis 8.

When the circuit board 6 is to be inserted into the chassis 8, the leading edge of the board is manually lowered into the guide 40, as seen in FIG. II, until the alignment housing 22 enters guide 40 and the leading end of jack screw 30 enters nut 42 as seen in FIG. III. In this position, alignment pins 14 begin to enter alignment holes 16 of the chassis but the male contact pins 10 have not yet engaged their female interconnects 12.

After this first step of inserting the circuit board, wherein alignment housing 22 is placed manually within guide 40 on chassis 8, jack screw 30 is rotated into nut 42 by a suitable drive tool, preferably having a torque indicator, not shown. As should be easily understood, as jack screw 30 is rotated, alignment housing 22 and attached strut 20 with circuit board 6 are pulled downwardly in turn moving the contact pins 10 of the circuit board into electrical engagement with female interconnects 12 on chassis 8. Strut 20 extends sufficiently over the circuit board to distribute the clamping load over the board and thereby assist in retaining the contact pins in alignment with respect to the female interconnects. Thus, there is no pin damaged due to misalignment.

The jack screw 30 is rotated until a predetermined torque is reached, indicating that the male contact pins are sufficiently engaged for proper electrical contact. The board is then fully inserted.

Since circuit board 6 cannot be removed without unscrewing the jack screw, it will remain firmly in place dispite vibration and similar forces which would otherwise tend to disengage the electrical contact pins 10 from the female interconnects 12. However, when it is desired to remove board 6, this may easily be accomplished by rotating jack screw 30 in an opposite direction until the jack screw is disengaged from nut 42. Then, the circuit board 6 extends sufficiently above the other adjacent circuit boards to be easily grasped and lifted from the chassis. Further, since in this position the male contacts are disengaged, there is no danger of damaging the contacts during removal.

From the above description, it should now be evident that a novel and useful device for inserting and clamping a circuit board has been invented. The device advantageously allows the board to be installed easily and quickly while maintaining the board in perfect alignment to prevent damage to contact pins. Once clamped, the board is retained positively such that it will not vibrate free or be removed inadvertently in any manner without first unscrewing the jack screw. Importantly, because of its simplicity of design, the device is economical and feasible to manufacture.

While I have typically described certain specific embodiments of my invention, it is of course understood that the invention is not limited to these particular forms, but rather is applicable broadly to numerous variations falling within the scope of the appended claims.

I claim:

1. A device for inserting and clamping a printed circuit board of the type having male pin-type contacts for connection with female interconnects within a chassis wherein the board is received in close array with adjacent boards comprising a circuit board component and a chassis component, said circuit board component consisting of a strut and an integral alignment housing, said strut fastened through depending strut tabs to the end of said circuit board opposite the male contact pins, said strut having a width slightly wider than the thickness of said circuit board, said strut extending over and conforming to a substantial portion of the upper contour of said board, said alignment housing suitably arranged to extend downwardly contiguous to one face of the circuit board and adjacent one end thereof when said strut is attached to said circuit board, a jack screw rotatably received but axially restrained within a central bore of said housing, said jack screw extending below said housing and having a reduced tip to facilitate engagement with a nut member, said jack screw having an enlarged head disposed within a central enlarged bore of said housing, said jack screw adapted to be driven by a tool; said housing having a generally rectangular configuration slightly larger in cross-section than the diameter of said jack screw with a locking projection extending along its length along one face thereof, said chassis component consisting of a substantially U-shaped channel-like guide and an attached guide nut, said guide secured adjacent an open end of said circuit board chassis with the longitudinal axis of said guide extending toward said female interconnects on said chassis, one depending leg of said guide extending further outwardly and then inwardly to form a wraparound portion, said guide adapted to slidably receive with limited clearance said alignment housing in a manner such that the locking projection of said alignment housing is carried within said wraparound portion, said guide arranged with respect to female interconnects on such chassis such that when said alignment housing is within said guide said male contacts on said circuit board are aligned with said female interconnects on said chassis, said locking projection of said alignment housing carried within said wraparound portion of said guide to confine said alignment housing and attached circuit board from tilting relative to the longitudinal axis of said guide, a guide nut attached to said guide for threaded engagement with said jack screw after said alignment housing is received within said guide and the male contacts of said circuit board are aligned with said female interconnects, said male contacts being inserted into electrical engagement with said female interconnects by rotation of said jack screw, and said strut acting to distribute the inserting load over said circuit board as said circuit board is inserted into said chassis.

* * * * *